(12) United States Patent
Ishikawa

(10) Patent No.: US 12,125,663 B2
(45) Date of Patent: Oct. 22, 2024

(54) EMITTER AND DEVICE PROVIDED WITH SAME

(71) Applicant: Denka Company Limited, Tokyo (JP)

(72) Inventor: Daisuke Ishikawa, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 18/550,077

(22) PCT Filed: Mar. 9, 2022

(86) PCT No.: PCT/JP2022/010356
§ 371 (c)(1),
(2) Date: Sep. 11, 2023

(87) PCT Pub. No.: WO2022/196499
PCT Pub. Date: Sep. 22, 2022

(65) Prior Publication Data
US 2024/0153730 A1    May 9, 2024

(30) Foreign Application Priority Data
Mar. 19, 2021 (JP) ................................ 2021-046160

(51) Int. Cl.
*H01J 37/073* (2006.01)
(52) U.S. Cl.
CPC ................... *H01J 37/073* (2013.01)
(58) Field of Classification Search
CPC .................................................... H01J 37/073
See application file for complete search history.

(56) References Cited

U.S. PATENT DOCUMENTS

| | | | |
|---|---|---|---|
| 3,631,291 A | 12/1971 | Favreau | |
| 4,427,886 A * | 1/1984 | Martin | H01J 37/073 |
| | | | 313/448 |
| 9,847,208 B1 * | 12/2017 | Adamec | H01J 1/304 |
| 2010/0194262 A1 * | 8/2010 | Nonogaki | H01J 37/073 |
| | | | 313/343 |
| 2022/0130634 A1 | 4/2022 | Zhang et al. | |

FOREIGN PATENT DOCUMENTS

| | | |
|---|---|---|
| DE | 2722497 A1 | 12/1977 |
| EP | 2175472 A1 | 4/2010 |
| GB | 1538660 A | 1/1979 |
| JP | S57-107533 A | 7/1982 |

(Continued)

OTHER PUBLICATIONS

The International Bureau of WIPO, International Preliminary Report on Patentability issued in International Application No. PCT/JP2022/010356 (Sep. 28, 2023).

(Continued)

*Primary Examiner* — Mary Ellen Bowman
(74) *Attorney, Agent, or Firm* — Leydig, Voit & Mayer, Ltd.

(57) ABSTRACT

An emitter includes an insulator, a pair of terminals attached to the insulator separately from each other, at least one filament attached between the pair of terminals in an arch shape, and an electron source fixed to the filament. The filament has bent portions between a contact with respect to the electron source and contacts with respect to the terminals. A device is provided with the emitter.

8 Claims, 14 Drawing Sheets

(56) References Cited

FOREIGN PATENT DOCUMENTS

| | | | |
|---|---|---|---|
| JP | H3-165432 | A | 7/1991 |
| JP | H06-076731 | A | 3/1994 |
| JP | 2003-331714 | A | 11/2003 |
| JP | 2010-287415 | A | 12/2010 |
| WO | WO 00/028566 | A1 | 5/2000 |
| WO | WO 2011/043353 | A1 | 4/2011 |
| WO | WO 2020/158297 | A1 | 8/2020 |

OTHER PUBLICATIONS

Japan Patent Office, International Search Report issued in International Application No. PCT/JP2022/010356 (May 17, 2022).
European Patent Office, Extended Search Report issued in European Application No. 22771250.2 (Apr. 18, 2024).

* cited by examiner

*Fig.*3

EMITTER AND DEVICE PROVIDED WITH SAME

CROSS-REFERENCE TO RELATED APPLICATIONS

This patent application is the U.S. national phase of International Application No. PCT/JP2022/010356, filed on Mar. 9, 2022, which claims the benefit of Japanese Patent Application No. 2021-046160, filed Mar. 19, 2021, the disclosures of which are incorporated herein by reference in their entireties for all purposes.

TECHNICAL FIELD

The present disclosure relates to an emitter and a device provided with the same.

BACKGROUND ART

An emitter is a device emitting an electron beam and is mounted in an electron microscope and a semiconductor inspection device, for example. A thermal field emission emitter is known as a form of an emitter. This emitter is provided with an insulator, a pair of terminals, an arch-shaped filament, and an electron source fixed to the filament. Patent Literature 1 discloses an invention relating to a thermal field radiation cathode used in electron microscopes, electron beam exposing machines, and the like. FIG. 2 of this literature illustrates a thermal field radiation cathode provided with a tungsten tip 1, a tungsten wire 3, an insulator 4, and a pair of metal struts 5. FIG. 7A of Patent Literature 2 also illustrates an emitter having a similar constitution.

CITATION LIST

Patent Literature

[Patent Literature 1] Japanese Unexamined Patent Publication No. H6-76731
[Patent Literature 2] Japanese Unexamined Patent Publication No. 2003-331714

SUMMARY OF INVENTION

Technical Problem

Since a filament provided in a thermal field emission emitter is heated to approximately 1,800 K at the time of operation, an electron source may be displaced due to thermal deformation of the filament. Excessive displacement of the electron source results in the following problems. That is, even if the coaxiality of an electron source with respect to a hole of a suppressor electrode or a hole of an extracting electrode provided in an emitter has been adjusted before heating, when the electron source is excessively displaced due to heating, they are deprived of the coaxiality. Accordingly, there is concern over an adverse influence on electron emission characteristics, and an irradiation direction and an irradiation position of an electron beam.

The present disclosure provides an emitter in which deviation of an irradiation direction and an irradiation position of an electron beam caused by displacement of an electron source is sufficiently small, and a device provided with the same.

Solution to Problem

An emitter according to an aspect of the present disclosure includes an insulator, a pair of terminals attached to the insulator separately from each other, at least one filament attached between the pair of terminals in an arch shape, and an electron source fixed to the filament. The filament has bent portions between a contact with respect to the electron source and contacts with respect to the terminals. Since the filament has the bent portions, stress due to thermal deformation is relaxed, and thus displacement of the electron source can be curbed.

It is preferable that when the emitter is viewed from a side in a state where the pair of terminals are positioned below and the emitter is disposed in a direction in which the electron source is positioned above the pair of terminals, the filament have at least first parts extending upward from the contacts with respect to the terminals, second parts bent from the first parts and extending obliquely upward, and third parts bent from the second parts and extending upward. Since the third parts extend upward, there is an advantage that the electron source is easily fixed to the third parts.

It is preferable that when the emitter disposed in a direction similar to that above is viewed from a side, a position of a contact between the filament and the electron source be shifted from positions of contacts between the terminals and the filament by 100 μm or longer in a horizontal direction. By employing this constitution, when the emitter is viewed from above, the electron source can be disposed at a center position between the pair of terminals.

In the present disclosure, for example, a material of the electron source is one kind of material selected from the group consisting of rare earth borides; high-melting point metals, and oxides, carbides, and nitrides thereof; and noble metal-rare earth alloys.

A device according to another aspect of the present disclosure is provided with the foregoing emitter. Examples of a device to be provided with the emitter include electron microscopes, semiconductor manufacturing devices, inspection devices, and machining devices.

Advantageous Effects of Invention

According to the present disclosure, an emitter in which deviation of an irradiation direction and an irradiation position of an electron beam caused by displacement of an electron source is sufficiently small, and a device provided with the same are provided.

DESCRIPTION OF EMBODIMENT

Figure 1:
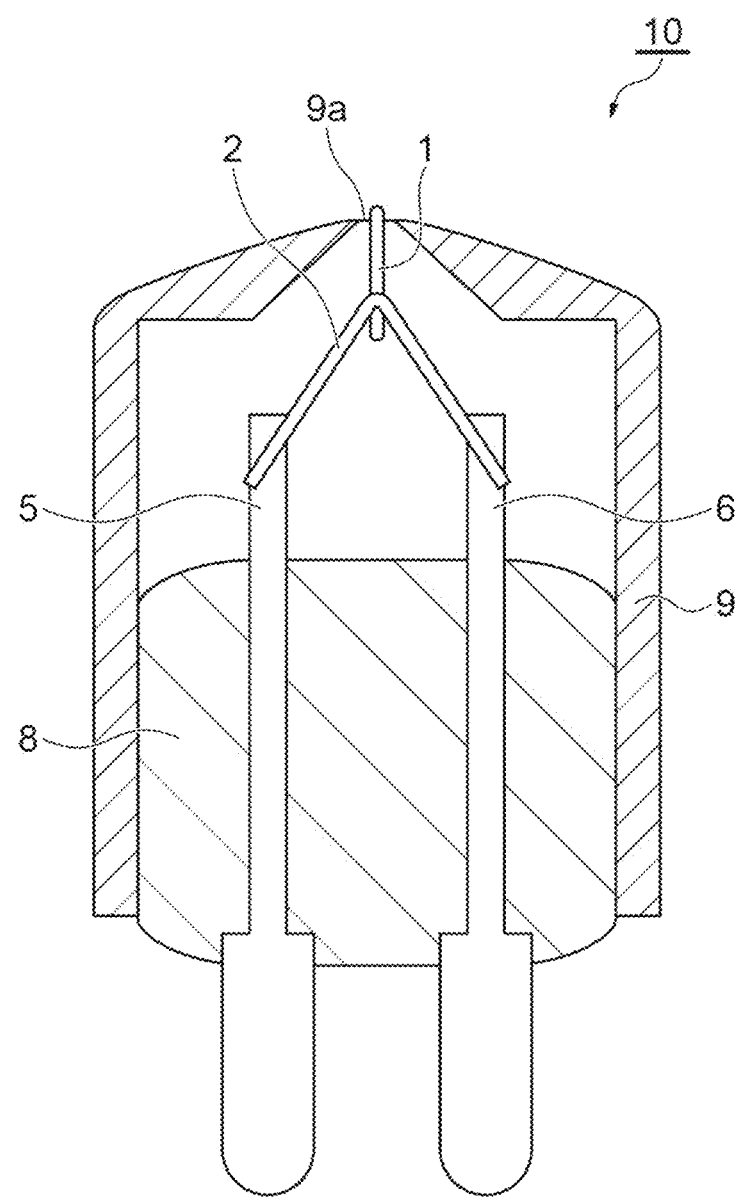
FIG. 1 is a partial cross-sectional view schematically illustrating an embodiment of an emitter according to the present disclosure.

Hereinafter, an embodiment of the present disclosure will be described in detail with reference to the drawings. In the following description, the same reference signs are applied to parts which are the same or corresponding, and duplicate description thereof will be omitted. In addition, unless otherwise stated, positional relationships such as up, down, left, right, and the like are based on the positional relationships illustrated in the drawings. The dimensional ratios in drawings are not limited to the illustrated ratios. When terms such as "left", "right", "front", "rear", "up", "down", "upward", and "downward" are utilized in description of this specification and the claims, these are intended for description and do not always permanently mean these relative positions.

<Emitter>

FIG. 1 is a partial cross-sectional view schematically illustrating an emitter according to the present embodiment. An emitter 10 illustrated in this diagram is referred to as a thermal field emission type. Examples of a device provided with the emitter 10 include an electron microscope, a semiconductor manufacturing device, an inspection device, and a machining device. The emitter 10 is provided with an electron source 1, an arch-shaped filament 2, a pair of terminals 5 and 6, an insulator 8, and a suppressor 9. The electron source 1 is heated by means of electrification with respect to the filament 2, and an electron beam is emitted from a tip portion of the electron source 1. A hole 9a is provided on an upper surface of the suppressor 9, which is disposed such that the electron source 1 protrudes through the hole 9a. From the viewpoint of electron emission characteristics and the like, it is preferable that coaxiality with respect to the hole 9a be maintained in the electron source 1 before and after electrification. FIGS. 2 to 5 are a perspective view, a front view, a side view, and a top view schematically illustrating an internal structure of the emitter illustrated in FIG. 1.

The electron source 1 is fixed to an apex portion of the arch-shaped filament 2 at a contact 1a. The electron source 1 is a tip of an electron emission material. Examples of an electron emission material include high-melting point metals such as tungsten, tantalum, and hafnium, and oxides, carbides, and nitrides thereof; rare earth borides such as lanthanum boride ($LaB_6$) and cerium boride ($CeB_6$); and noble metal-rare earth alloys such as iridium cerium. From the viewpoint of electron emission characteristics, strength, and machinability, it is preferable that the electron source 1 be a single crystal tungsten tip having an axis orientation of <100> orientation. In this case, a source supplying zirconium and oxygen (refer to FIG. 1 of Patent Literature 1) is applied to a part on a surface of the tip. By continuously supplying zirconium and oxygen to the surface of the tip from the supply source, a ZrO layer covering the surface of the tip is continuously formed. Accordingly, rise in the work function of the tip is curbed, and therefore the function as a thermal field radiation cathode is maintained for a long period of time.

The filament 2 is for heating the electron source 1 by means of electrification. The filament 2 is attached between the pair of terminals 5 and 6 in an arch shape. It is preferable that the material of the filament 2 be a high-melting point metal having a melting point of 2,200° C. or higher. Specific examples thereof include tungsten and alloys of tungsten and a high-melting point metal (for example, rhenium). Tungsten doped with an alkali metal (for example, potassium) for composition stabilization may be used. When both ends of the arch-shaped filament 2 are respectively bonded to the terminals 5 and 6 and the electron source 1 is bonded to the apex portion of the filament 2, there is an advantage that bonding work can be efficiently performed compared to when a filament is constituted using two wires. That is, when one arch-shaped filament is used, a manufacturing step can become simpler than when end portions of two wires on one side are respectively bonded to a pair of terminals and an electron source is bonded to end portions thereof on the other side.

When the emitter is viewed from a side, both end portions of the filament 2 are bonded to the front side (the right side in FIG. 4) of the pair of terminals 5 and 6. A contact 5a is a location where one end portion of the filament 2 is bonded to a side surface of the terminal 5. A contact 6a is a location where the other end portion of the filament 2 is bonded to a side surface of the terminal 6 (refer to FIG. 3). The contact 1a is a location where the electron source 1 and the filament 2 are bonded to each other.

Figure 2:
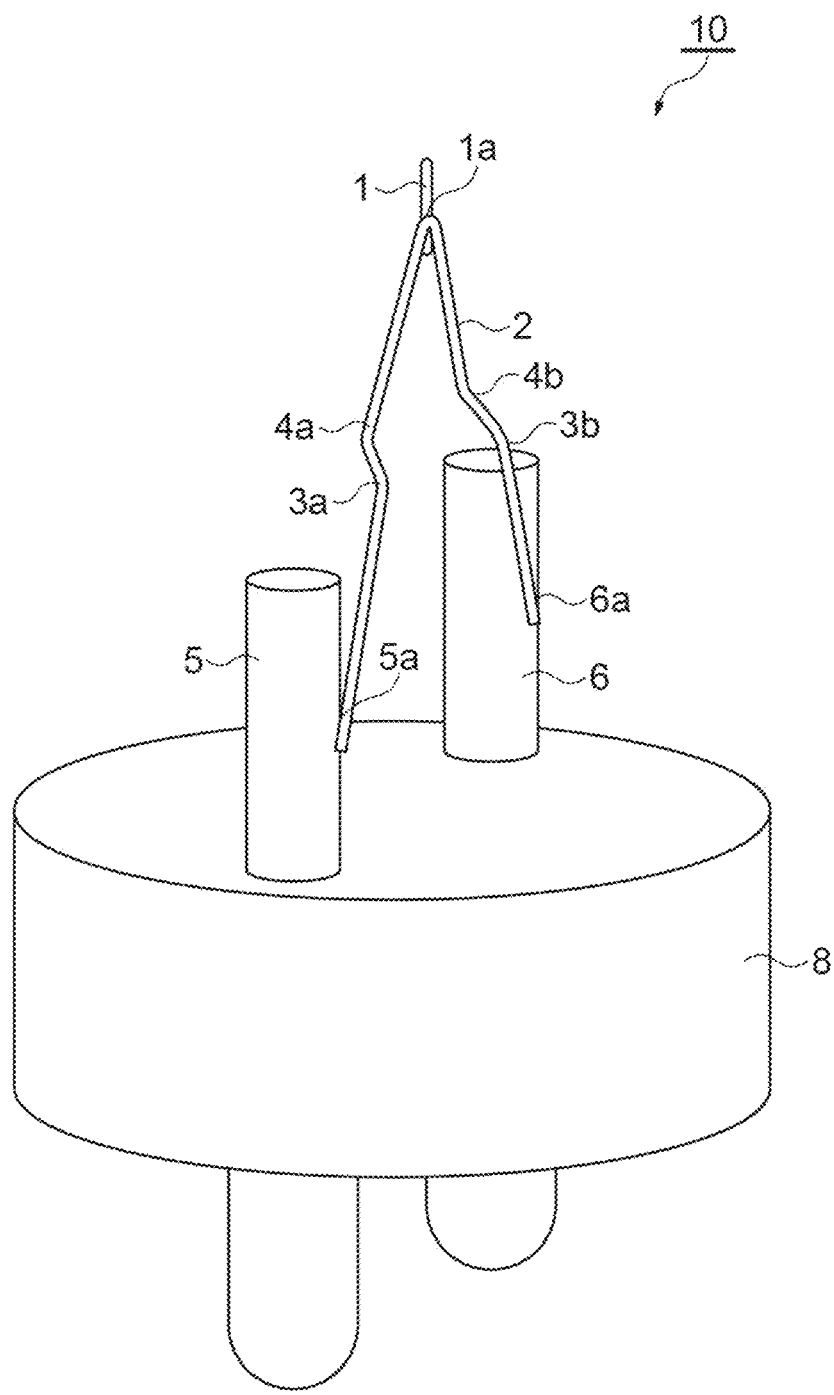
FIG. 2 is a perspective view schematically illustrating an internal structure of the emitter illustrated in FIG. 1.
Figure 3:
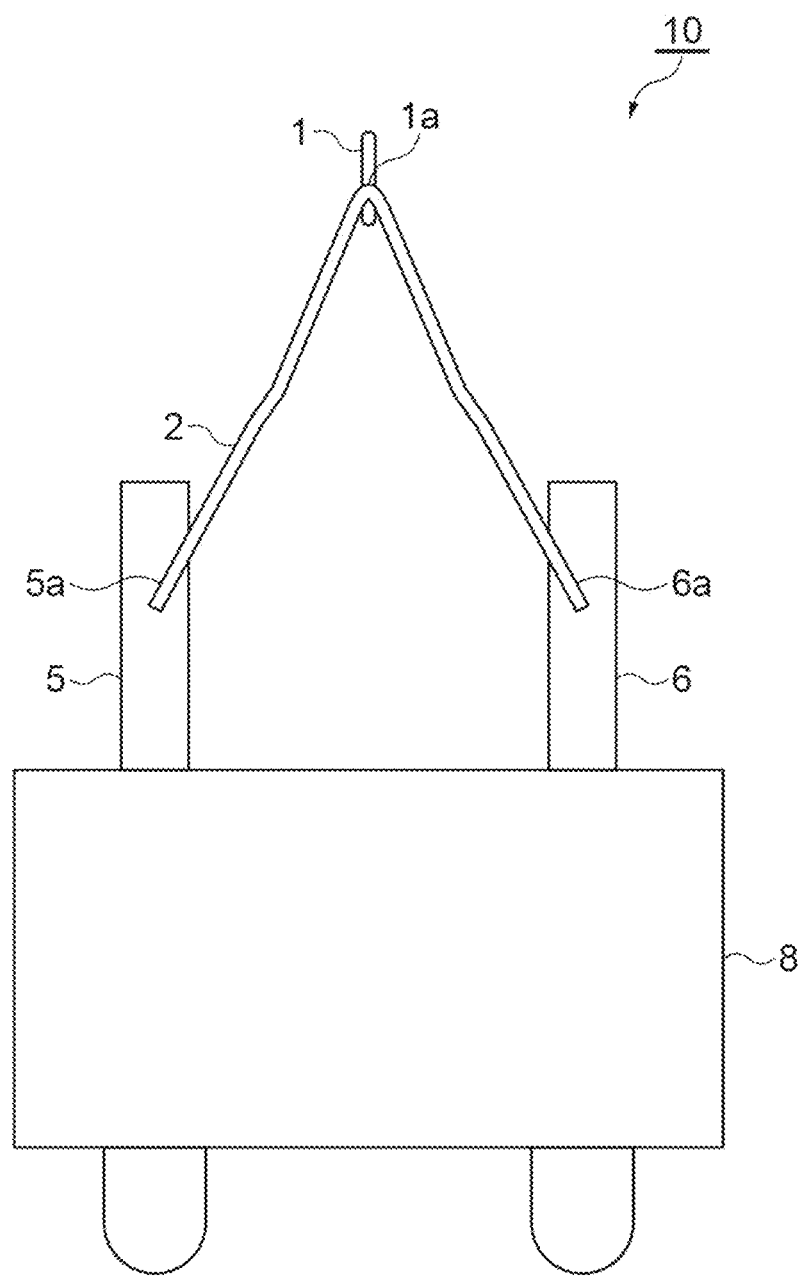
FIG. 3 is a front view of the internal structure illustrated in FIG. 2.

As illustrated in FIG. 2, a pair of bent portions 3a and 3b and a pair of bent portions 4a and 4b are formed in the filament 2 according to the present embodiment. Since the filament 2 has a plurality of bent portions, stress due to thermal deformation is relaxed, and thus displacement of the electron source 1 can be curbed. For example, the pair of bent portions 3a and 3b are simultaneously formed by folding a machined filament having an arch shape, and the same applies to the pair of bent portions 4a and 4b as well. The bent portions 3a and 4a are provided between the contact 5a and the contact 1a. The bent portion 3b and 4b are provided between the contact 6a and the contact 1a.

A bending angle in the bent portions 3a and 3b (the angle α in FIG. 4) is 10° to 40°, for example, and it may be 15° to 30°. A bending angle (the angle β in FIG. 4) in the bent portions 4a and 4b is also 10° to 40°, for example, and it may also be 15° to 30°. When this angle is 10° or larger, second parts 2b, which are necessary to provide a shift distance D (the distance D illustrated in FIG. 4, which will be described below) to a certain extent or longer, tend to be able to be shortened. On the other hand, when the angle is 40° or smaller, folding tends to be easily performed.

Figure 4:
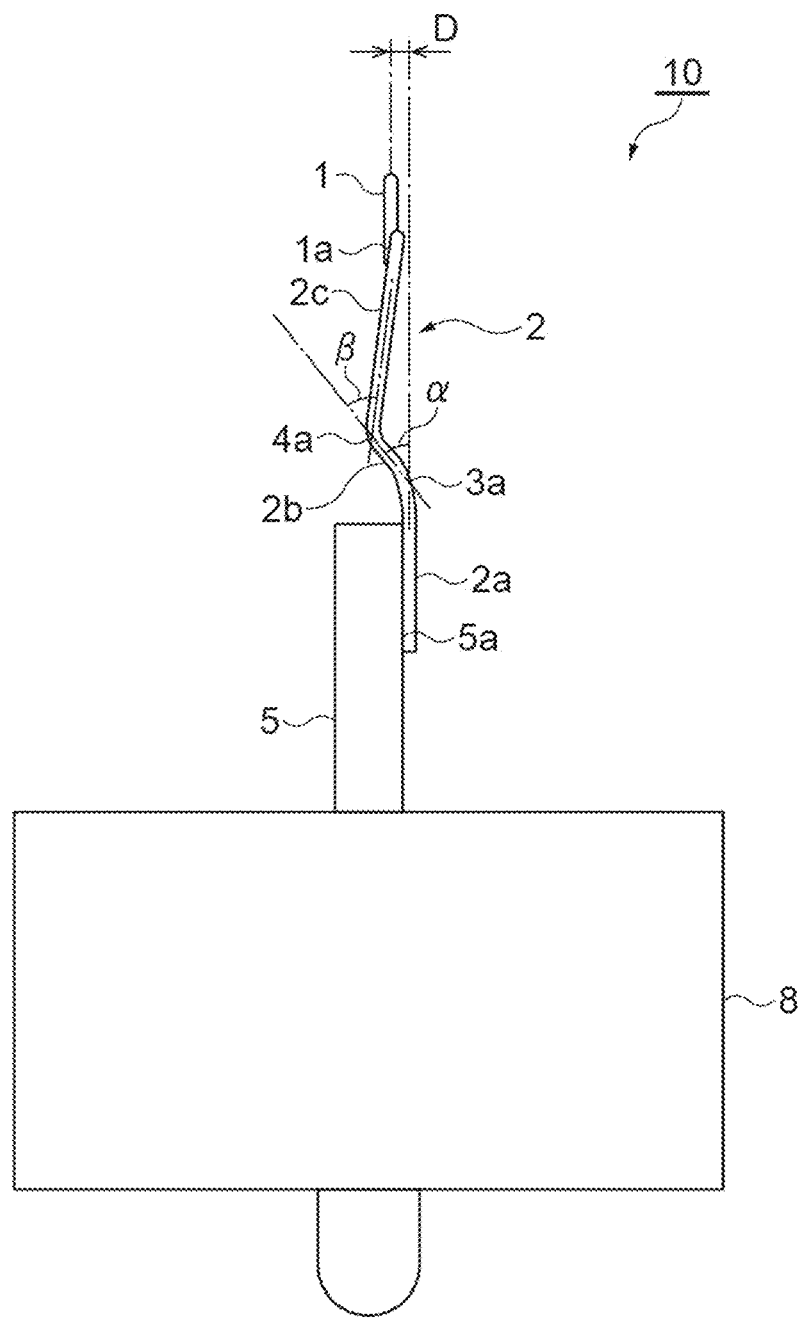
FIG. 4 is a side view of the internal structure illustrated in FIG. 2.
Figure 5:
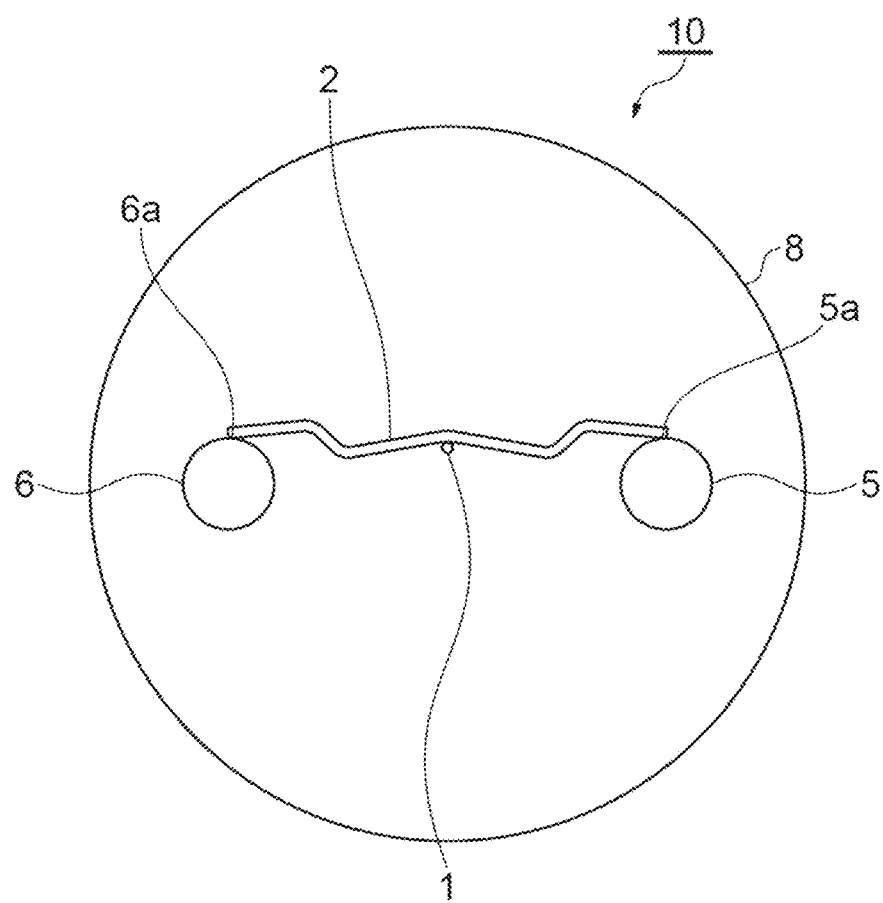
FIG. 5 is a top view of the internal structure illustrated in FIG. 2.

As illustrated in FIG. 4, when the emitter 10 is viewed from a side (in a direction in which the terminal 6 on the other side is hidden by the terminal 5 on one side and cannot be seen), the filament 2 has first parts 2a extending upward from the contact 5a with respect to the terminal 5, the second parts 2b bent from the first parts 2a and extending obliquely upward, and third parts 2c bent from the second parts 2b and extending upward. When viewed from a side, since the second parts 2b are inclined to the center side (the left side in FIG. 4) of the terminal 5, the electron source 1 can be disposed at the center position between the pair of terminals 5 and 6 when viewed from above (refer to FIG. 5). In addition, since the third parts 2c to which the electron source 1 is bonded extend upward, there is also an advantage that work of fixing the electron source 1 is easily performed. When the angle α and the angle β illustrated in FIG. 4 are practically the same, the extending direction of the first parts 2*a* and the extending direction of the third parts 2*c* can coincide with each other. These extending directions coincide with the irradiation direction of an electron beam, and it is preferable to coincide with the extending direction of the needle-shaped electron source 1 as well.

When the emitter 10 is viewed from a side, it is preferable that the position of the contact 1*a* between the filament 2 and the electron source 1 be shifted from the position of the contact 5*a* between the terminal 5 and the filament 2 by 100 μm or longer in a horizontal direction (the leftward direction in FIG. 4). Accordingly, when the emitter 10 is viewed from above, the electron source 1 can be disposed at the center position between the pair of terminals 5 and 6. This shift distance (the distance D illustrated in FIG. 4) may be set in accordance with the thicknesses of the terminals 5 and 6 and the electron source 1. The shift distance D may be 100 to 700 μm or 400 to 600 μm. In the present embodiment, a form in which the electron source 1 is bonded to the rear side (the left side in FIG. 4) of the filament 2 has been described as an example. However, when a sufficiently long shift distance D can be set, the electron source 1 may be bonded to the front side (the right side in FIG. 4) of the filament 2.

Hereinabove, the embodiment of the present disclosure has been described, but the present invention is not limited to the foregoing embodiment. For example, in the foregoing embodiment, a thermal field emission-type emitter has been described, but a form according to the foregoing embodiment may also be applied to a field emission-type emitter. A field emission-type emitter does not require the suppressor 9 illustrated in FIG. 1. In addition, for example, a single crystal tungsten tip having an axis orientation of <310> orientation is used as an electron source.

Figure 6:
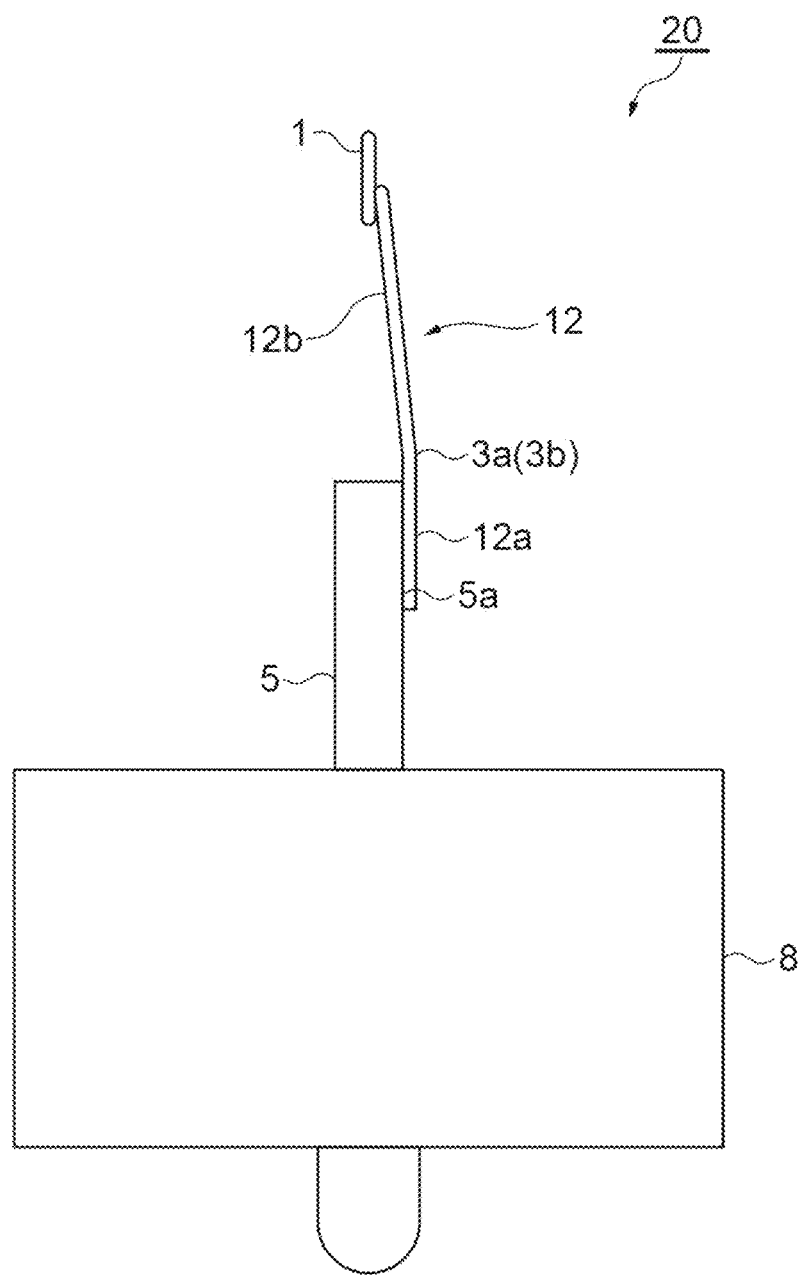
FIG. 6 is a side view schematically illustrating the internal structure of the emitter according to another embodiment of the present disclosure.

In the foregoing embodiment, a case in which the filament 2 has two pairs of bent portions has been described as an example, but the filament may have a pair of bent portions or three or more pairs of bent portions. An emitter 20 illustrated in FIG. 6 is provided with a filament 12 having the pair of bent portions 3*a* and 3*b*. When viewed from a side, the filament 12 has a first part 12*a* extending upward from the contact 5*a*, and a second part 12*b* bent from the first part 12*a* and extending obliquely upward, and the electron source 1 is fixed to the apex portion of the second part 12*b*. When viewed from a side, the second part 12*b* is inclined to the center side (the left side in FIG. 6) of the terminal 5. In addition, in the foregoing embodiment, a case in which the emitter 10 is provided with one filament 2 has been described as an example. However, the emitter may be provided with a plurality of filaments, may have a structure in which one electron source is fixed to each of a plurality of filaments, or may have a structure in which one electron source is fixed by a plurality of filaments.

EXAMPLES

Hereinafter, the present disclosure will be described on the basis of examples and a comparative example. The present invention is not limited to the following examples.

Example 1

Figure 7:
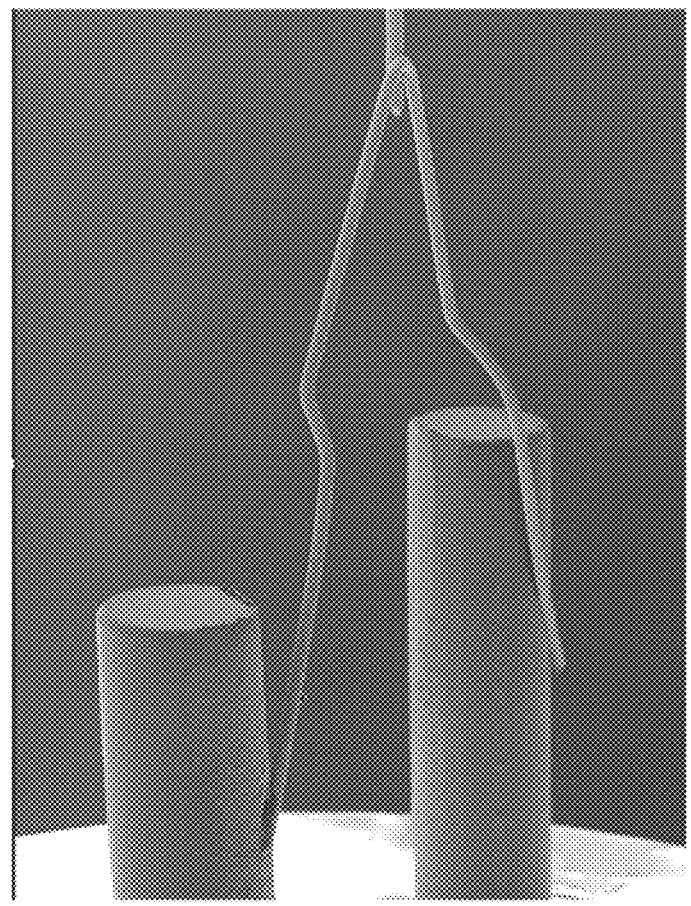
FIG. 7 is an SEM photograph of a filament according to Example 1.
Figure 8:
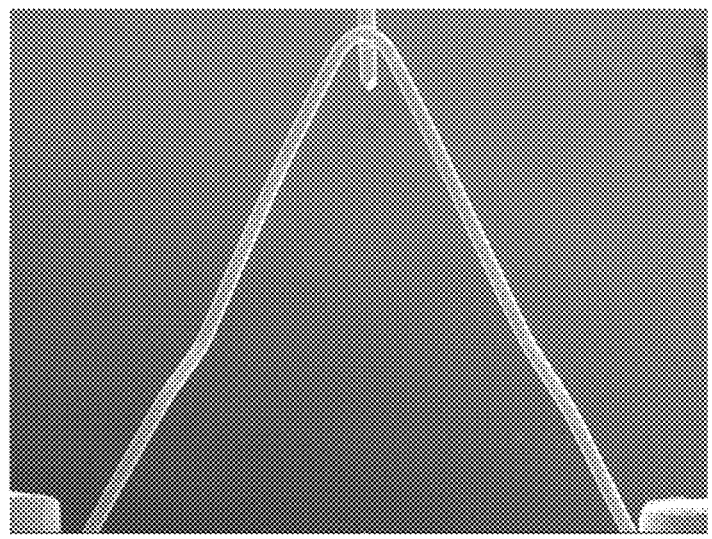
FIG. 8 is an SEM photograph of the filament according to Example 1.
Figure 9:
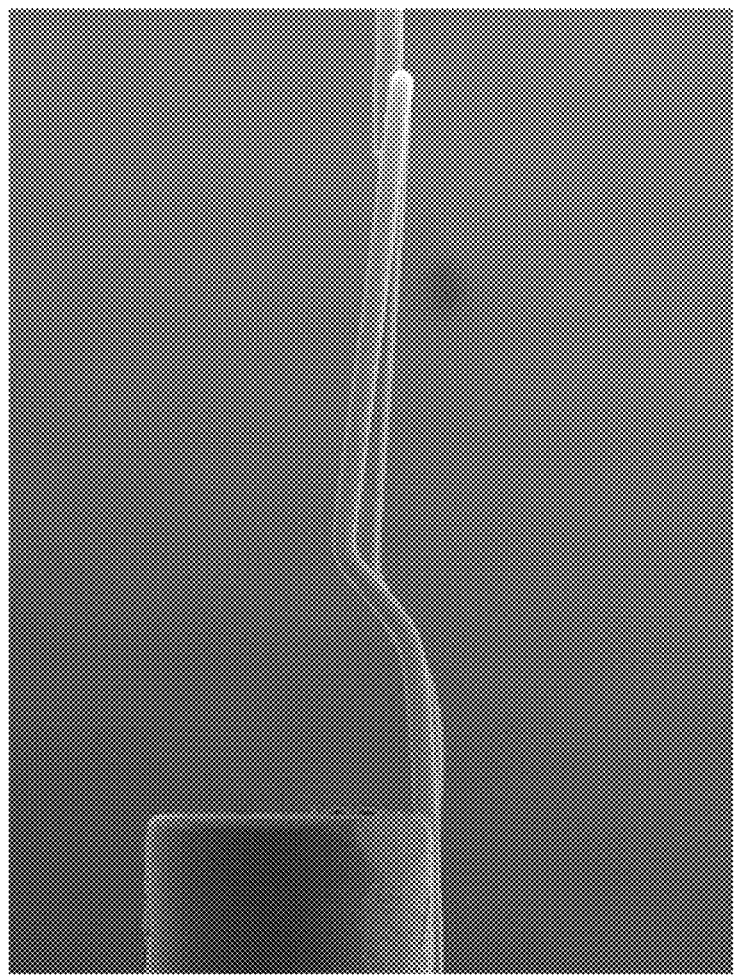
FIG. 9 is an SEM photograph of the filament according to Example 1.
Figure 10:
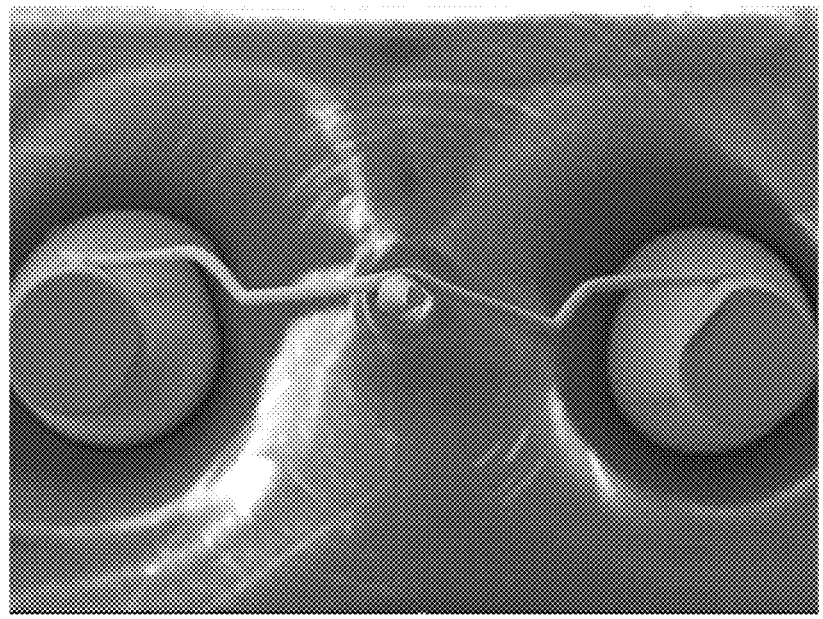
FIG. 10 is an SEM photograph of the filament according to Example 1.

The following materials were prepared.
Electron source: single crystal tungsten tip (diameter: 0.1 mm, length: 1.2 mm, axis orientation of <100>)
Filament: tungsten-rhenium filament (diameter: 0.1 mm, length: 14 mm) Emitters having constitutions illustrated in FIGS. 1 to 5 were produced using the foregoing materials. FIGS. 7 to 10 are SEM photographs of the filament according to Example 1. FIG. 7 illustrates the filament in its entirety. FIG. 8 illustrates a shape when the filament is viewed from the front. FIG. 9 illustrates a shape when the filament is viewed from a side. FIG. 10 illustrates a shape when the filament is viewed from above.

The emitter according to Example 1 was produced by the following procedure. First, two pairs of bent portions were formed in an arch-shaped filament. Both the bent portions had a bending angle of 20°. Thereafter, end portions of the filament were bonded to a pair of terminals by welding. Further, an electron source was bonded to the apex portion of the filament by welding. As illustrated in FIG. 9, the end portions of the filament were respectively bonded to the front side (the right side in FIG. 9) of the pair of terminals, and the electron source was bonded to the rear side (the left side in FIG. 9) of the filament.

Example 2

An emitter having the constitution illustrated in FIG. 6 was produced in a manner similar to that of Example 1 except that a pair of bent portions (the bending angle: 20°) were formed in place of two pairs of bent portions (the bending angle: 20°) formed in the filament.

Comparative Example 1

Figure 11:
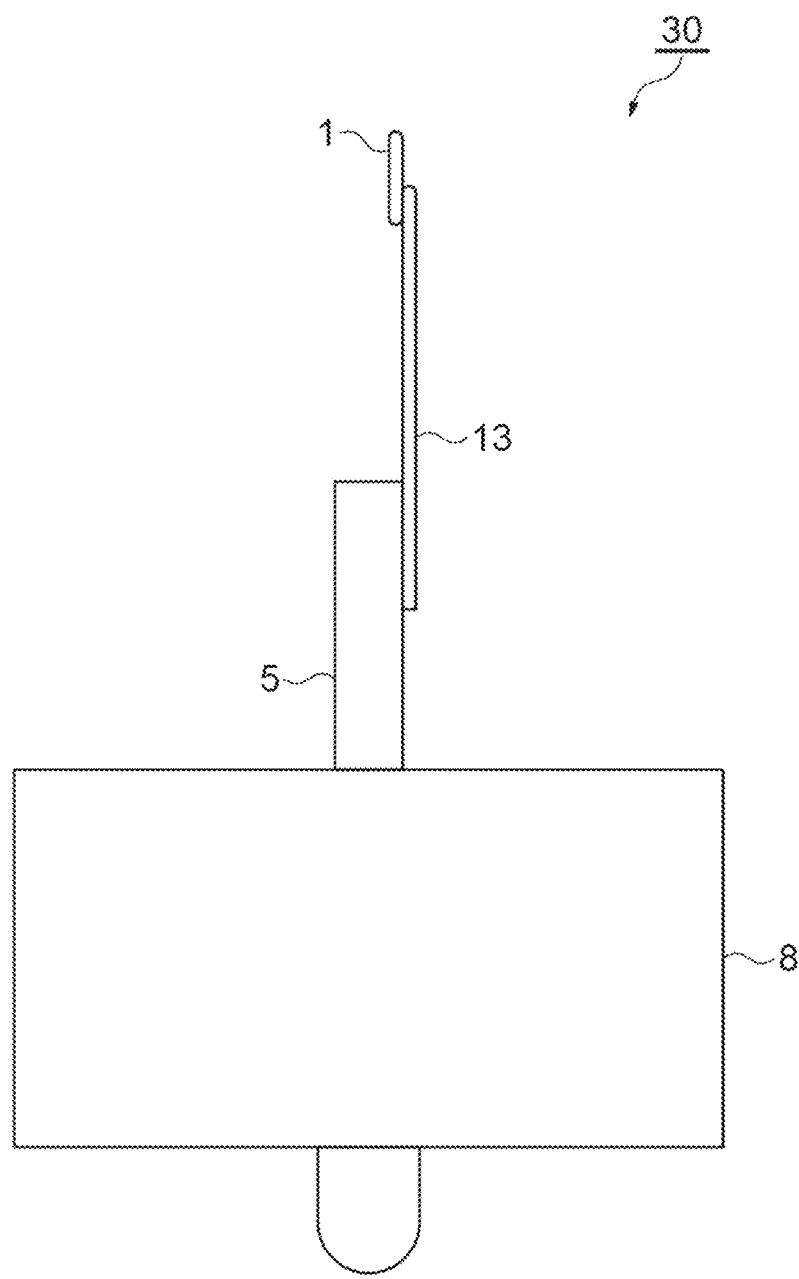
FIG. 11 is a side view schematically illustrating a constitution of the emitter according to Comparative Example 1.

An emitter having the constitution illustrated in FIG. 11 was produced in a manner similar to that of Example 1 except that no bent portions were provided in the filament. An emitter 30 illustrated in FIG. 11 is provided with an arch-shaped filament 13 in which no bent portions were formed.

[Measurement of Amount of Displacement of Electron Source]

Figure 12:
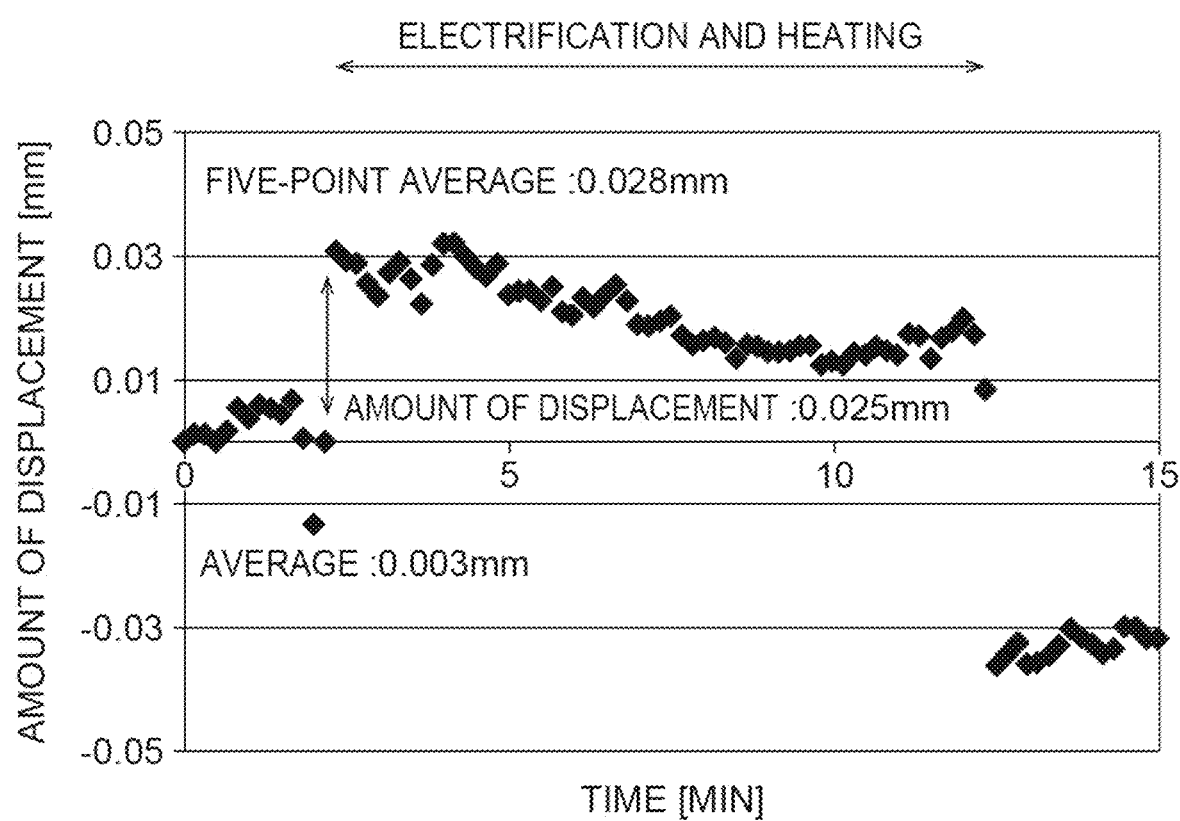
FIG. 12 is a graph showing an amount of displacement of an electron source of the emitter according to Example 1.
Figure 13:
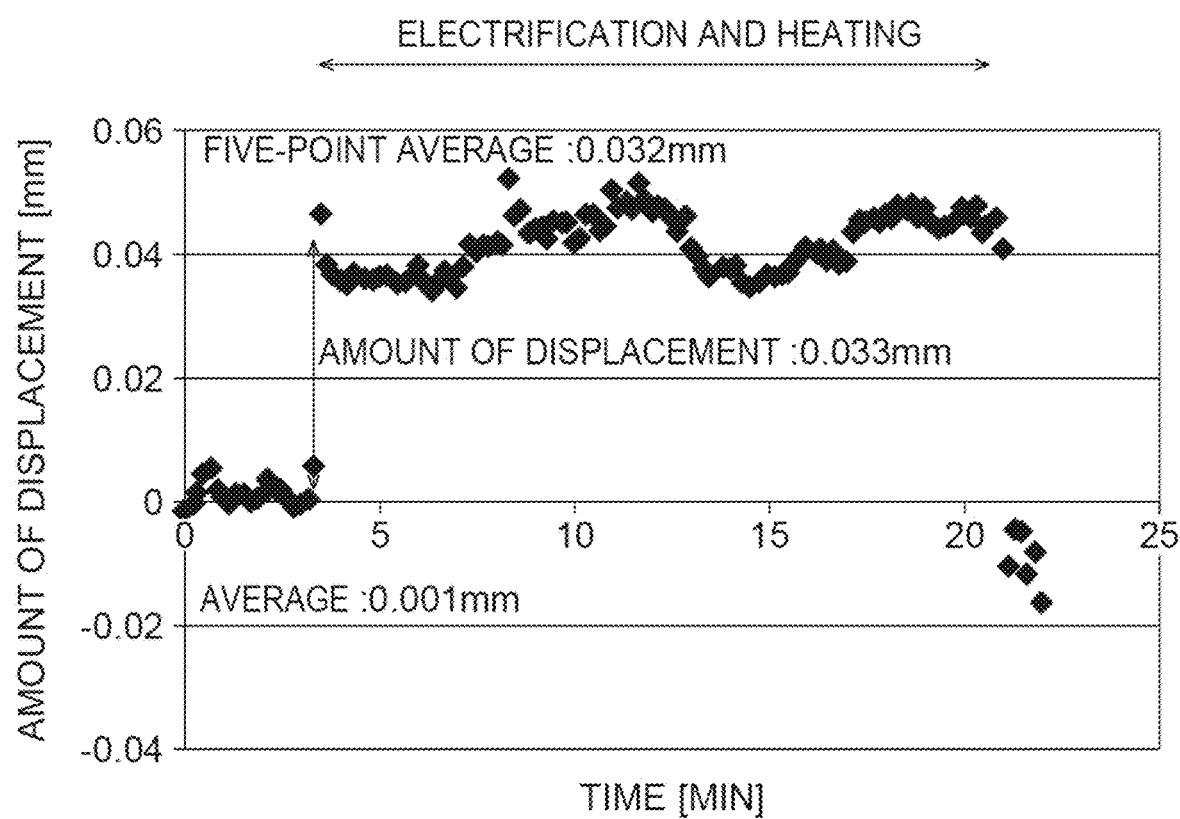
FIG. 13 is a graph showing an amount of displacement of the electron source of the emitter according to Example 2.
Figure 14:
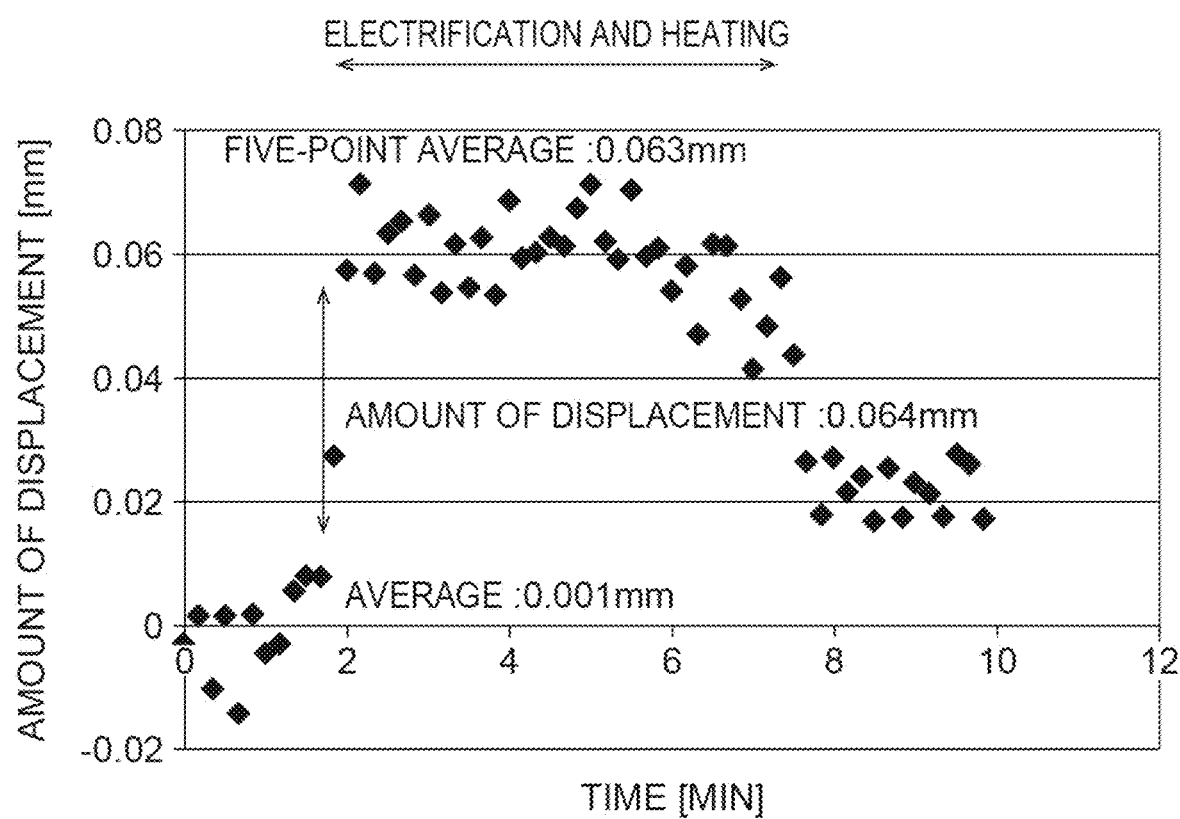
FIG. 14 is a graph showing an amount of displacement of the electron source of the emitter according to Comparative Example 1.

Amounts of displacement of the electron source when the filaments of the respective emitters according to the examples and the comparative example were electrified and heated were measured. The device and the conditions for the measurement are as follows. FIGS. 12 to 14 shows the results.

Measurement device: laser displacement meter (manufactured by KEYENCE CORPORATION, product name: multi-color laser displacement meter CL-3000)
Electrification time: 5 to 15 minutes
Current value: 1.54 A
Voltage: 1.6 V
Displacement direction: lateral direction in FIGS. 4, 6, and 11

The results of Examples 1 and 2 and Comparative Example 1 indicate that displacement of the electron source due to electrification can be reduced by providing bent portions in the filament.

REFERENCE SIGNS LIST

1: Electron source, 1*a*: Contact, 2, 12: Filament, 2*a*: First part, 2*b*: Second part, 2*c*: Third part, 5, 6: Terminal, 3*a*, 3*b*, 3*a*, 3*b*: Bent portion, 5*a*, 6*a*: Contact, 8: Insulator, 9: Suppressor, 9*a*: Hole, 10, 20: Emitter, 12*a*: First part, 12*b*: Second part, 13: Filament (comparative example), 30: Emitter (comparative example), a, 13: Bending angle, D: Shift distance

The invention claimed is:

1. An emitter comprising:
an insulator;
a pair of terminals attached to the insulator separately from each other;
at least one filament attached between the pair of terminals in an arch shape; and
an electron source fixed to the filament,
wherein the filament has bent portions between a contact with respect to the electron source and contacts with respect to the terminals, and
wherein when the emitter is viewed from a side in a state where the pair of terminals are positioned below and the emitter is disposed in a direction in which the electron source is positioned above the pair of terminals, the filament has at least first parts extending upward from the contacts with respect to the terminals, second parts bent from the first parts and extending obliquely upward, and third parts bent from the second parts and extending upward.

2. An emitter comprising:
an insulator;
a pair of terminals attached to the insulator separately from each other;
at least one filament attached between the pair of terminals in an arch shape; and an electron source fixed to the filament,
wherein the filament has bent portions between a contact with respect to the electron source and contacts with respect to the terminals, and
wherein when the emitter is viewed from a side in a state where the pair of terminals are positioned below and the emitter is disposed in a direction in which the electron source is positioned above the pair of terminals, a position of a contact between the filament and the electron source is shifted from positions of contacts between the terminals and the filament by 100 μm or longer in a horizontal direction.

3. The emitter according to claim 1,
wherein a material of the electron source is selected from the group consisting of rare earth borides; high-melting point metals, and oxides, carbides, and nitrides thereof; and noble metal-rare earth alloys.

4. A device comprising the emitter according to claim 1.

5. The device according to claim 4, wherein the device is selected from the group consisting of an electron microscope, a semiconductor manufacturing device, an inspection device, and a machining device.

6. The emitter according to claim 2,
wherein a material of the electron source is selected from the group consisting of rare earth borides; high-melting point metals, and oxides, carbides, and nitrides thereof; and noble metal-rare earth alloys.

7. A device comprising the emitter according to claim 2.

8. The device according to claim 7, wherein the device is selected from the group consisting of an electron microscope, a semiconductor manufacturing device, an inspection device, and a machining device.

* * * * *